United States Patent [19]

Merchant

[11] Patent Number: 5,399,962

[45] Date of Patent: Mar. 21, 1995

[54] APPARATUS FOR DETECTING DAMPED WAVE DISTURBANCES

[76] Inventor: Roger R. Merchant, 811 9th St., St. Paul, Nebr. 68873

[21] Appl. No.: 128,863

[22] Filed: Sep. 29, 1993

[51] Int. Cl.$^6$ .................... G01R 31/02; G01V 3/00
[52] U.S. Cl. ...................... 324/72; 324/377; 73/158; 338/48
[58] Field of Search ........... 324/72, 377; 340/601; 361/113; 335/47, 48; 73/153

[56] References Cited

U.S. PATENT DOCUMENTS

| | | | |
|---|---|---|---|
| 2,961,511 | 11/1960 | Ovshinsky | 335/48 |
| 3,609,526 | 9/1971 | Chaberski | 324/377 |
| 3,686,563 | 8/1972 | Walter | 324/377 |
| 4,907,448 | 3/1990 | Givens | 73/153 |
| 4,985,800 | 1/1991 | Feldman et al. | 361/113 |

FOREIGN PATENT DOCUMENTS 1350587  11/1987  Japan .................. 324/377

*Primary Examiner*—Maura K. Regan
*Attorney, Agent, or Firm*—Zarley, McKee, Thomte, Voorhees & Sease

[57] ABSTRACT

An apparatus for detecting damped wave disturbances includes a hollow tubular housing of electrically non-conductive material with a pair of electrodes extending through apertures in each end of the housing such that the inner ends of the electrodes are spaced apart a predetermined distance within the housing. Ferro-magnetic electrically conductive particles are disposed loosely within the housing of sufficient quantity to form an electrical bridge between the electrodes when the particles are influenced by a magnetic field. A pair of annular collars of electrically conductive material are fastened to the housing and spaced coaxially apart, with one collar electrically connected to an antenna and the second collar electrically connected to ground. The particles within the housing have a very low electrical resistance when influenced by a magnetic field, so as to form an electrically conductive bridge. The particles also have a very high electrical resistance when not influenced by a magnetic field. The outer ends of the electrodes are electrically connected to an electrical circuit which preferably will operate an active device in response to the detection of the damped wave disturbance.

8 Claims, 1 Drawing Sheet

APPARATUS FOR DETECTING DAMPED WAVE DISTURBANCES

TECHNICAL FIELD

The present invention relates generally to devices for opening an electrical circuit in response to lightning discharges or electrical arcing between two electrical conductors, and more particularly to an apparatus for detecting an electrical disturbance caused by lightning discharge or other electrical arcing.

BACKGROUND OF THE INVENTION

Lightning strikes from electrical storms are a serious threat to all types of electrical equipment. A nearby lightning strike can burn out circuits in an electrical device such that repair is impossible and replacement is the only alternative. Other electrical disturbances, such as short circuits or electrical arcing between a pair of conductors are an equally serious threat to electrical equipment. While there are various types of surge and spike protectors on the market, these are not designed to protect against the extreme conditions present during a lightning strike or the electrical disturbance caused by arcing between a pair of conductors.

The inventor herein provided an improved apparatus for unplugging various electrical equipment, as discussed in U.S. Pat. No. 5,083,042. The unplugging apparatus of that patent included a sensing circuit designed to sense the approach of an electrical storm and thereby activate a solenoid and mechanical actuator to unplug a desired piece of electrical equipment. The sensing circuit of the '042 patent required that a radio frequency coil be tuned to a little used frequency, such that a lightning discharge would cause static to be received at that frequency, which would be sensed by the sensing circuit.

The main problem with the sensing circuit described in the inventor's '042 patent, as well as the remaining prior art, is in the fact that such electronic circuits utilized for the detection of radio frequency disturbances cannot discriminate between damped and undamped wave signals, but rather depend upon the magnitude of the distance to determine a "triggering event". Because prior art sensing circuits cannot discriminate between damped and undamped radio frequency signals, "false triggering" can easily occur at frequent intervals due to other sources of potential static which do not threaten the electrical equipment.

SUMMARY OF THE INVENTION

It is therefore a general object of the present invention to provide an improved apparatus for detecting damped wave disturbances.

Another object of the present invention is to provide an apparatus which discriminates between damped and undamped wave disturbances.

Still another object is to provide a damped wave detector which consumes no power until such time as a damped wave disturbance of sufficient magnitude is sensed.

These and other objects of the present invention will be apparent to those skilled in the art.

The apparatus for detecting damped wave disturbances of the present invention includes a hollow tubular housing of electrically nonconductive material with a pair of electrodes extending through apertures in each end of the housing such that the inner ends of the electrodes are spaced apart a predetermined distance within the housing. Ferro-magnetic electrically conductive particles are disposed loosely within the housing of sufficient quantity to form an electrical bridge between the electrodes when the particles are influenced by a magnetic field. A pair of annular collars of electrically conductive material are fastened to the housing and spaced coaxially apart, with one collar electrically connected to an antenna and the second collar electrically connected to ground. The particles within the housing have a very low electrical resistance when influenced by a magnetic field, so as to form an electrically conductive bridge. The particles are of a material which has a very high electrical resistance when not influenced by a magnetic field, such that the electrodes are electrically separated. An electrical disturbance of the damped wave type will be detected either through the antenna or ground and signals transmitted to the powers on the housing to form a capacitance relative to the particles and electrodes which produces a magnetic field so as to cause the particles to form an electrical bridge between the electrodes. The outer ends of the electrodes are electrically connected to an electrical circuit which preferably will operate an active device in response to the detection of the damped wave disturbance.

DESCRIPTION OF THE PREFERRED EMBODIMENTS

Figure 1:
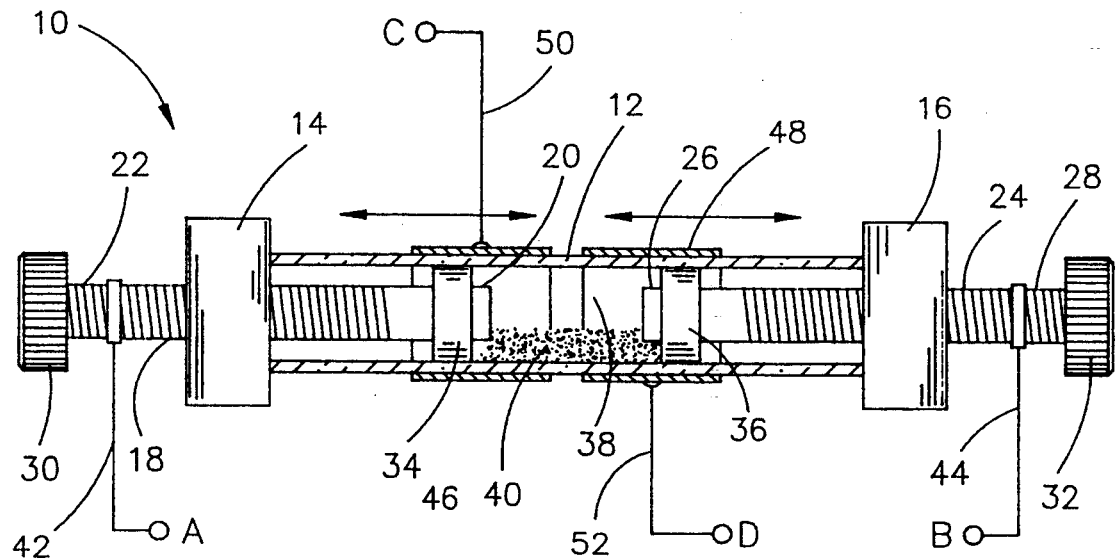
FIG. 1 is a partial cross sectional view through coherer of the present invention.

Referring now to the drawings, in which similar or corresponding parts are identified with the same reference numeral, and more particularly to FIG. 1, the coherer of the present invention is designated generally at 10 and is utilized to detect damped wave disturbances emanating from ground, induced in a conductor, or emanating from the atmosphere. Coherer 10 includes a non-conductive glass tube 12 having opposing end plugs 14 and 16 respectively. A threaded electrode 18 is journaled through a threaded aperture in plug 14, with an inward end 20 extending within tube 12, and an outward end 22 projecting coaxially outward from tube 12. A second electrode 24 is threaded through an aperture in plug 16 with an inward end 26 disposed within tube 12 and an outward end 28 projecting coaxially outward from tube 12.

A knob 30 is mounted on the outward end 22 of electrode 18 which permits manual rotation of electrode 18 on its threads to adjust the location of inward end 20 relative to inward end 26 of electrode 24. A similar knob 32 on the outward end of electrode 24 permits adjustment of electrode 24 in a similar fashion. A spacer 34 is mounted on electrode 18 adjacent the inward end 20 so as to form a seal between electrode 18 and glass tube 12. A second spacer 36 on electrode 24 forms a seal between electrode 24 and glass tube 12. In this fashion, a sealed chamber 38, of adjustable length, is formed between electrode ends 20 and 26. Terminals A and B are electrically connected to electrodes 18 and 24 via conductors 42 and 44 respectively.

A metallic powder or metallic filings 40 are disposed within that chamber 38, and lie loosely therein. In operation, a damped wave disturbance produced by a lightning discharge, or by the arcing between two electrical conductors, produces a static disturbance within the radio frequency spectrum, as well as an electromagnetic pulse having a magnitude dependent upon the available energy delivered by the discharge. The electromagnetic pulse acts upon metallic powder 40 to cause the filings to become slightly magnetized and attracted to one another. This magnetized condition of filings 40 reduces the resistance of the metallic filings so as to transform a non-conductive chamber 38 into an electrically conductive bridge between electrodes 18 and 24. The conductive bridge formed between electrodes 18 and 24 thereby permit the flow of electrical current to pass between the electrodes by virtue of the detected damped wave disturbance.

Man-made disturbances, in the form of radio frequency activity generated by transmitters and the like, do not produce the electromagnetic pulse, nor the damped wave which is detected by coherer 10. Thus, false triggering of coherer 10 by various man-made disturbances is virtually eliminated. These characteristics are enhanced in the circuit described in FIG. 2, by a sensitivity or threshold control in combination with coherer 10, thereby permitting response to damped wave disturbances with magnitudes sufficiently strong to overcome the internal impedance of coherer 10.

It has been found that the operation of coherer 10 is linked to electromagnetic pulse and capacitive conduction of a static field through a dielectric (tubular housing 12). To provide this capacitive conduction, a capacitor is formed with respect to electrodes 18 and 24 utilizing a pair of electrically conductive collars 46 and 48 wrapped around housing 12 and spaced apart a distance of approximately ⅛ inch to 1/4 inch. Collars 46 and 48 are preferably formed of two small sheets of metal foil wrapped around the housing and fastened in position. A terminal C is connected to collar 46 via a conductor 50 while terminal D is connected to collar 48 via conductor 52. Terminal C is preferably connected to the antenna of a device, while terminal D is connected to ground. Terminals A and B are the output connections of coherer 10 which close a circuit upon the detection of a damp wave disturbance.

As noted above, collars 46 and 48 form a capacitor with respect to the electrodes 18 and 24 and filings 40. The detected damped wave disturbance is conducted through housing 12 via capacitive conduction, where it acts upon the filings to become slightly magnetized, attracted to one another, and thereby forming an electrically conductive bridge between the electrodes. However, it can be seen that the use of collars 46 and 48 connected to the input terminals C and D provides separation from the output terminals A and B, thereby reducing the risk of damage to sensitive electrical components from direct exposure to a static field. This arrangement also reduces stray static fields from building up on the outer surface of housing 12, which could hamper or impair the proper operation of coherer 10.

Figure 2:
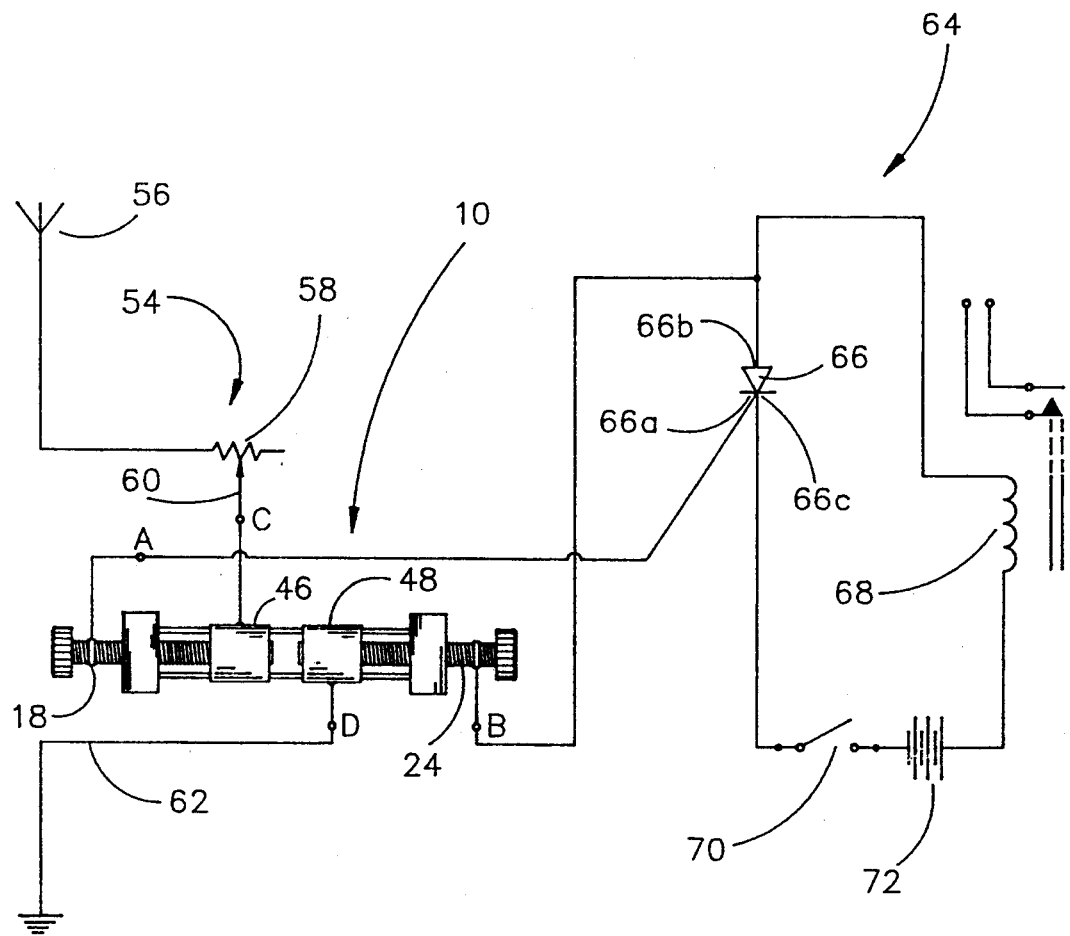
FIG. 2 is a schematic diagram of a circuit for detecting damped wave disturbances, which permits adjustment of disturbance magnitude required to trip the circuit, and connected to an active electronic device.

Referring now to FIG. 2, an electrical circuit 54 is shown which utilizes coherer 10 to detect damped wave disturbances either in the atmosphere or from ground. An antenna 56 is electrically connected to a variable resistor 58, with the wiper element 60 of variable resistor 58 electrically connected to terminal C of coherer 10. As discussed above, terminal C is electrically connected to collar 46. Collar 48 is electrically connected through terminal D to ground by conductor 62.

Coherer 10 may be connected to any desired active device, using an ancillary electrical circuit designated generally at 64. In the example shown in FIG. 2, ancillary circuit 64 includes a silicone controlled rectifier 66 connected to a relay 68, as described in more detail hereinbelow.

Terminal A from electrode 18 is electrically connected to the gate input 66a of SCR 66. The opposite output terminal B from electrode 24 is connected to the anode 66b of SCR 66. The cathode 66c of SCR 66 is connected through an on/off switch 70 to a battery 72 and thence to relay 68. The circuit is completed by connecting relay 68 to anode 66b of SCR 66. Active device 68 is designed to work an ancillary portion of the circuit upon activation by coherer 10. Battery 72 provides the necessary power for working a load, shown in circuit 64 as a relay 68, upon activation of circuit 64. Relay 68 is preferably utilized to activate lightning protection devices, such as the unplugging apparatus of the applicant's '042 patent. On/off switch 70 provides a switch for interruption of power to the active device.

In operation, when a damped wave oscillation or similar radiant energy disturbance is detected at antenna 56 and/or ground, a static or combination of static and kinetic field, is built up in and around the capacitor formed by collars 46 and 48. If the field is of sufficient strength to overcome the inherent resistance of the dielectric of the tube 12, the ensuing capacitive discharge passes through the dielectric, which acts upon the filings to suddenly take on magnetic properties and thereby reduce the resistance through the filings to permit current flow via output terminals A and B to ancillary circuit 64. This activation of circuit 64 will activate the load or other active device 68. Switch 70 permits the opening of the ancillary circuit 64 so as to "reset" the coherer 10 by breaking the electrical bridge through filings 40.

Whereas the invention has been shown and described in connection with the preferred embodiments thereof, it will be understood that many modifications, substitutions and additions may be made which are within the intended broad scope of the appended claims. There has therefore been shown and described an improved apparatus for detecting damped wave disturbances which accomplishes at least all of the above stated objects.

I claim:

1. An apparatus for detecting damped wave disturbances, comprising:
   a hollow generally tubular housing of electrically nonconductive material having closed first and second ends;
   a first electrode extending through an aperture formed in the first housing end, having an inner end positioned within the interior of the housing and an outer end positioned exteriorly of the housing;
   a second electrode extending through an aperture formed in the second housing end, having an inner end positioned within the interior of the housing and an outer end positioned exteriorly of the housing;
   said inner ends of said electrodes being spaced apart within said housing;
   a plurality of ferro-magnetic electrically conductive particles disposed loosely within said housing in sufficient quantity to form an electrical bridge between said electrodes when influenced by a magnetic field;

said particles of a material having a lower electrical resistance when influenced by a magnetic field, and a higher electrical resistance when uninfluenced by a magnetic field; and means connected to said housing for capacitively conducting a damped wave disturbance through said housing to produce a magnetic field which influences said particles into a condition of lower electrical resistance, creating an electrical path between said electrodes;

said means for capacitively conducting a damped wave disturbance including:

a first generally annular collar fastened to said housing and coaxially therewith;

a second generally annular collar fastened to said housing and coaxially therewith, spaced axially from the first collar;

said first and second collars located generally centrally on said housing and electrically separated from said electrodes and located to form a capacitance relative to said particles and electrodes.

2. The apparatus of claim 1, wherein said particles are a material with an electrical resistance of approximately 10 ohms when influenced by a magnetic field, and an electrical resistance of approximately 800 million ohms when uninfluenced by a magnetic field.

3. The apparatus of claim 1, wherein said capacitance of said collars, filings and electrodes is approximately 600–800 pf.

4. The apparatus of claim 1, wherein an antenna for detecting atmospheric damped wave disturbances is electrically connected to said first collar.

5. The apparatus of claim 1, wherein said second collar is electrically connected to ground.

6. The apparatus of claim 4, wherein said second collar is electrically connected to ground.

7. An apparatus for detecting damped wave disturbances, comprising:

a hollow generally tubular housing of electrically nonconductive material having closed first and second ends;

a first electrode extending through an aperture formed in the first housing end, having an inner end positioned within the interior of the housing and an outer end positioned exteriorly of the housing;

a second electrode extending through an aperture formed in the second housing end, having an inner end positioned within the interior of the housing and an outer end positioned exteriorly of the housing;

said inner ends of said electrodes being spaced apart within said housing;

said first and second electrodes being selectively adjustably mounted to said housing for selective movement inwardly and outwardly along the longitudinal axis of said housing, permitting selective adjustment of the distance between the inner ends of said electrodes;

a plurality of ferro-magnetic electrically conductive particles disposed loosely within said housing in sufficient quantity to form an electrical bridge between said electrodes when influenced by a magnetic field;

said particles of a material having a lower electrical resistance when influenced by a magnetic field, and a higher electrical resistance when uninfluenced by a magnetic field; and means connected to said housing for capacitively conducting a damped wave disturbance through said housing to produce a magnetic field which influences said particles into a condition of lower electrical resistance, creating an electrical path between said electrodes.

8. An apparatus for detecting damped wave disturbances, comprising:

a hollow generally tubular housing of electrically nonconductive material having closed first and second ends;

a first electrode extending through an aperture formed in the first housing end, having an inner end positioned within the interior of the housing and an outer end positioned exteriorly of the housing;

a second electrode extending through an aperture formed in the second housing end, having an inner end positioned within the interior of the housing and an outer end positioned exteriorly of the housing;

said inner ends of said electrodes being spaced apart within said housing;

a plurality of ferro-magnetic electrically conductive particles disposed loosely within said housing in sufficient quantity to form an electrical bridge between said electrodes when influenced by a magnetic field;

said particles of a material having a lower electrical resistance when influenced by a magnetic field, and a higher electrical resistance when uninfluenced by a magnetic field; and means connected to said housing for capacitively conducting a damped wave disturbance through said housing to produce a magnetic field which influences said particles into a condition of lower electrical resistance, creating an electrical path between said electrodes; and a first seal means mounted on the inner end of said first electrode to seal the electrode within said housing and prevent particles from escaping outwardly beyond the inner end of said first electrode, and a second seal means mounted on said second electrode inner end to prevent said particles from moving outwardly beyond the inner end of said second electrode, said first and second seal means forming a chamber retaining said particles therebetween.

* * * * *